United States Patent [19]

Simkins et al.

[11] Patent Number: 5,204,807
[45] Date of Patent: Apr. 20, 1993

[54] POSTAGE METER HOUSING ARRANGEMENT HAVING RF AND ELECTROMAGNETIC INDUCTION SHIELDING

[75] Inventors: Barry W. Simkins; Brian R. O'Neale, both of Harlow, Great Britain

[73] Assignee: Pitney Bowes plc., Harlow, England

[21] Appl. No.: 930,442

[22] Filed: Aug. 19, 1992

Related U.S. Application Data

[63] Continuation of Ser. No. 682,827, Apr. 9, 1991, abandoned.

[51] Int. Cl.⁵ .......................... H05K 5/02; H05K 7/14; H05K 7/20
[52] U.S. Cl. .................................... 361/399; 361/383; 361/424; 235/101
[58] Field of Search ............... 361/380, 381, 383, 386, 361/387, 388, 394, 39, 399, 424; 200/5 A, 5 R, 305; 174/35 R; 364/708; 235/101

[56] References Cited

U.S. PATENT DOCUMENTS 4,084,214 4/1978 Eppich .
4,650,973 3/1987 Pike .
4,683,519 7/1987 Murakami ........................ 361/424
4,788,447 11/1988 Kiyono et al. .................... 307/10 R
4,794,489 12/1988 Brown ................................ 361/424

OTHER PUBLICATIONS

M. B. Jewell and Mark W. Johnson, "Internally Modular Signal Generator Mechanical Design", Hewlett-Packard Journal Dec., 1985.

Primary Examiner—Leo P. Picard
Assistant Examiner—Michael W. Phillips
Attorney, Agent, or Firm—Charles G. Parks, Jr.; Melvin J. Scolnick

[57] ABSTRACT

In order to eliminate complex sheet forming operations, to provide an effective heat sink and to shield against radio frequency interference and electromagnetic induction effects, the housing arrangement has two assemblies which each comprise, inter alia, a die casting made of zinc or other material having equivalent radio frequency interference and electromagnetic induction shielding properties. A main logic circuit board is shielded by the two die castings when they are assembled together.

5 Claims, 3 Drawing Sheets

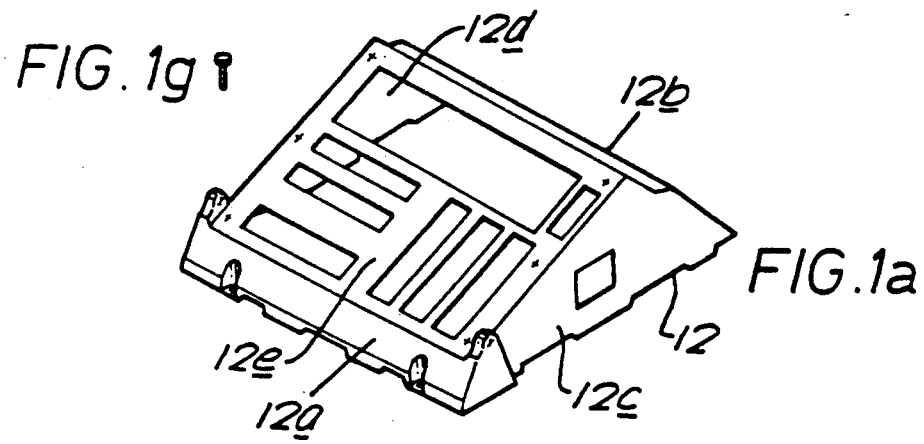
FIG. 1g
FIG. 1a
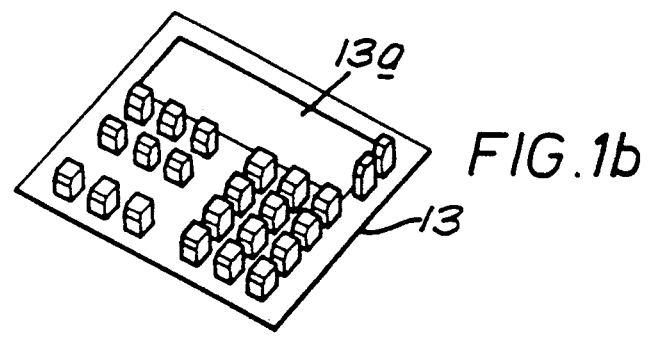
FIG. 1b
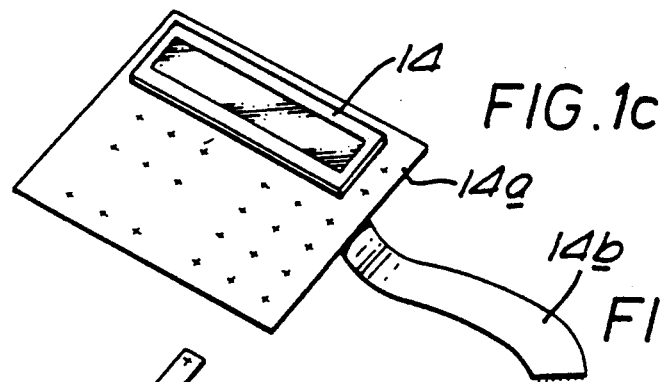
FIG. 1c
FIG. 1d
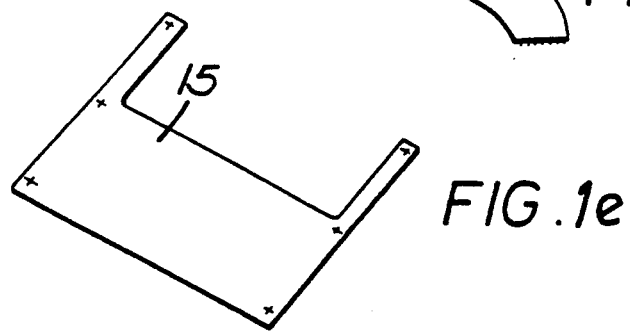
FIG. 1e
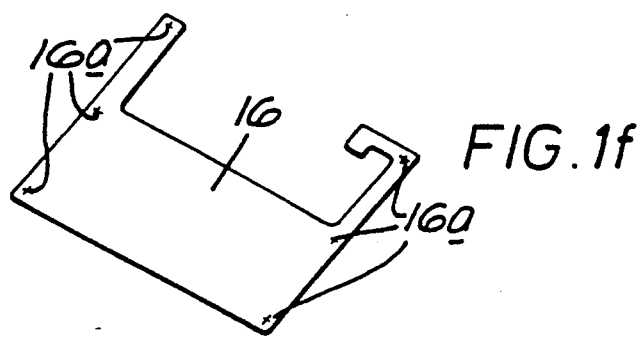
FIG. 1f

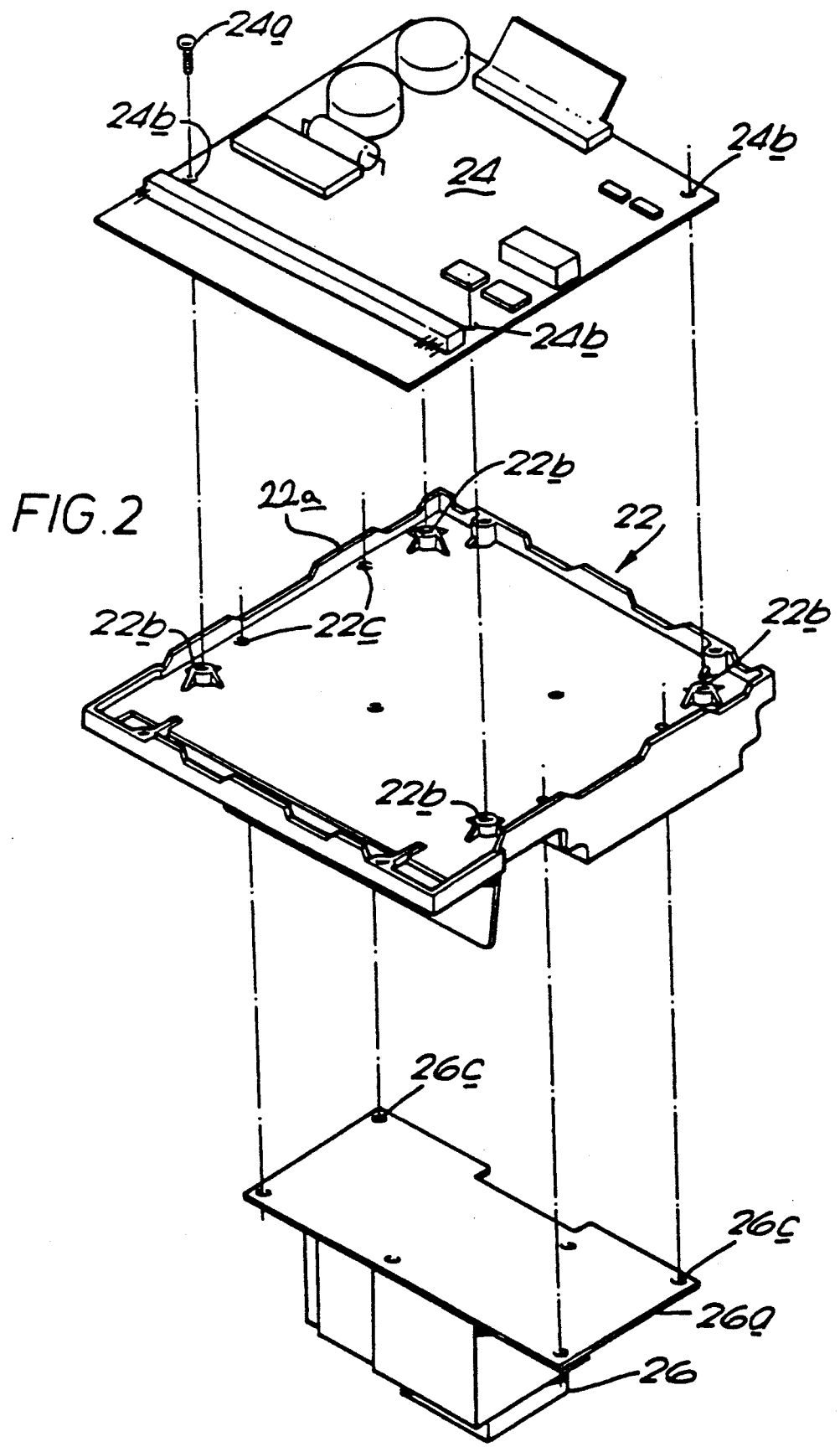

POSTAGE METER HOUSING ARRANGEMENT HAVING RF AND ELECTROMAGNETIC INDUCTION SHIELDING

This application is a continuation of application Ser. No. 07/682,827, filed Apr. 9, 1991, abandoned.

BACKGROUND OF THE INVENTION

This invention relates to a housing arrangement for use in a device which includes a key pad, a display, electronic circuitry, and a power supply unit. The invention is described herein with particular reference to a housing arrangement for certain parts of an electronic postage meter, but it will be realised that the present invention is likely to be applicable in other machines.

In the manufacture of machines such as postage meters, it is desirable to eliminate complex sheet forming and pressing and other operations on sheet metal. It is also desirable to provide some form of heat sink whereby unwanted heat generated in the power supply unit can be effectively dissipated, and it is further desirable to provide adequate shielding against radio frequency interference and electromagnetic induction effects as otherwise the proper operation of electronic circuitry in the machine may be compromised. Additionally, as well as meeting these to some extent conflicting requirements, it is desirable to have a housing arrangement which is relatively cheap to manufacture and easily assembled without intricate manipulating operations during manufacture.

SUMMARY OF THE INVENTION

The present invention aims to meet or at least substantially meet all or most of these objectives.

According to the present invention, there is provided a housing arrangement for use in a device including a keypad, a display, a main logic circuit board, and a power supply unit, the housing arrangement comprising:
 (I) a first assembly comprising (a) a first die casting of zinc or other material having equivalent radio frequency interference shielding and electromagnetic induction shielding properties, (b) the keypad, and (c) the display; and
 (II) a second assembly comprising a second die casting to an upper surface of which is attached the main logic circuit board and to a lower surface of which is attached the power supply unit.

For brevity in this specification the said zinc or other material is referred to merely as "shielding material" and use of the words "shielding material" in this specification and the claims is to be taken to mean such material.

In a preferred embodiment of the invention, the first assembly die casting has front, rear and two side walls all integral with a sloping apertured top wall. The apertures in the top wall permit the display to be read and permit keypad buttons to extend upwardly through the die casting.

According to an advantageous embodiment of the invention, the second assembly die casting is substantially planar and has a rim which interfits with the lower edges of the die casting of the first assembly.

Preferably, but not necessarily, the first assembly comprises, assembled together in order, a metal support plate, an insulating plate, the display attached to a display support board, the keypad, and the first die casting, the first die casting being uppermost.

To provide electrical connection between the display and the main logic board, any suitable electrical connection means may be employed, but preferably a so-called flying ribbon comprising multiple electrical conductors is connected at one end to the display and at its other end to the main logic board. This is particularly useful in that it enables the first assembly to be separated a short distance away from the second assembly, if desired, without breaking the electrical connection between these two assemblies. Access for component replacement is therefore much easier due to this feature.

In a preferred particular embodiment of the invention, the housing assembly includes metal plates serving as heat sinks and attached to the second die casting. Such metal plates may be attached to, and one at each side of, the second die casting. They may be bolted on.

While reference has been made above to parts being attached to the second die casting on its lower and upper surfaces, it will be appreciated that the arrangement may be reversed if this is particularly desirable in certain circumstances. The arrangement illustrated herein is however preferred.

The broadest aspect of the present invention involves making a connection around their rims between first and second die castings, such connection preferably being by way of self-tapping or so-called "Taptite" screws.

The invention will be better understood from the following non-limiting description of an example thereof, given with reference to the accompanying drawings in which:

BRIEF DESCRIPTION OF THE DRAWINGS

FIGS. 1a–1g show in perspective exploded view various components which make up a first assembly in a housing arrangement according to one example of the invention;

FIG. 2 is a similar view showing components which make up a second assembly in a housing arrangement according to the invention.

DETAILED DESCRIPTION OF THE PREFERRED EMBODIMENT

Figure 3:
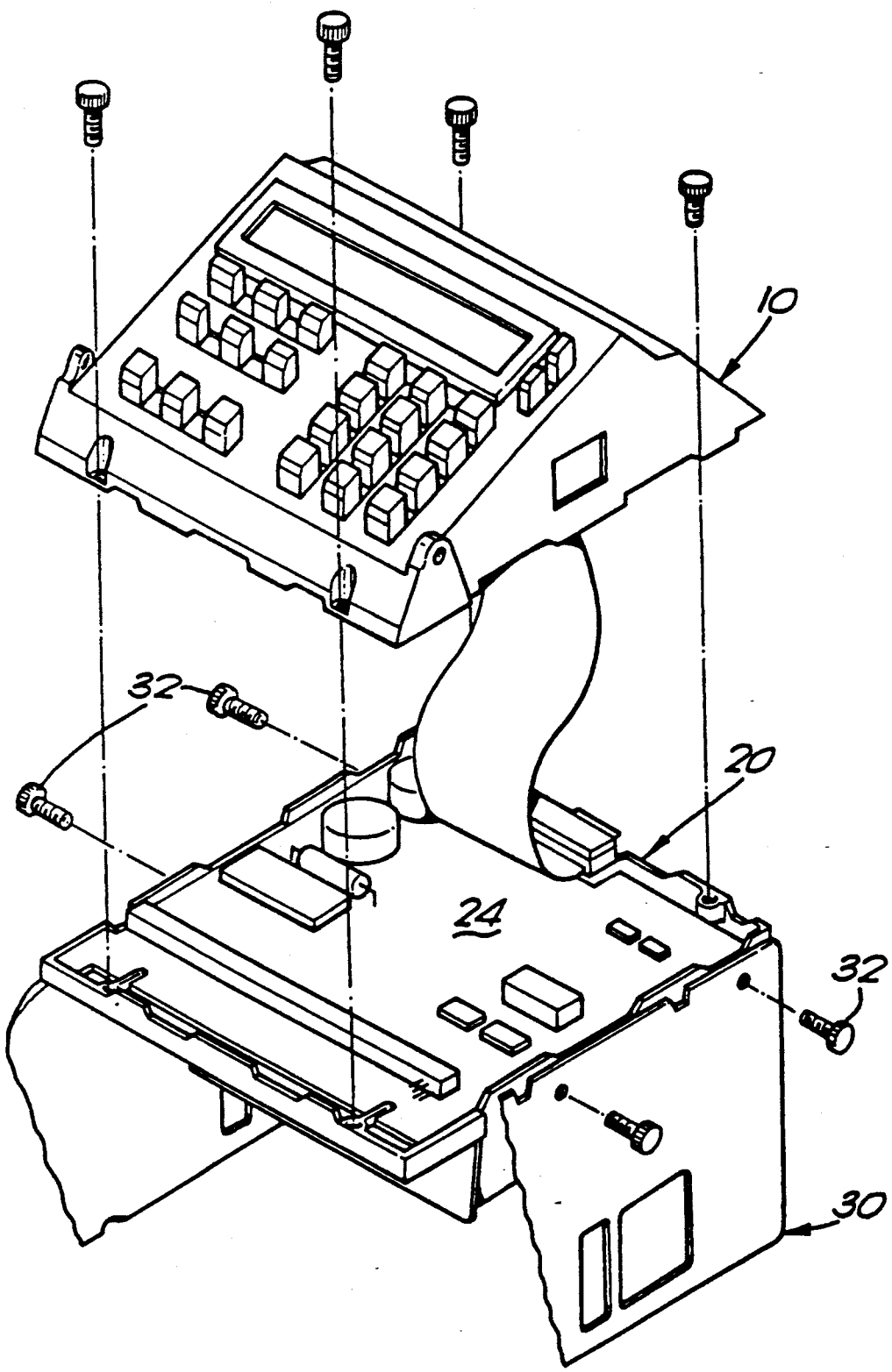
FIG. 3 is a similar view showing the first assembly about to be united with the second assembly and with side plates, to produce an example of a housing assembly according to the invention.

Referring firstly to FIGS. 1a–1g, these Figures illustrate the components of a first assembly 10 according to one particular example of the invention. In general terms the housing arrangement is made up of a first assembly 10 (FIG. 3) and a second assembly 20 (FIG. 3). The first assembly comprises a first die casting 12 having a front wall 12a, a rear wall 12b, side walls 12c and 12d, and a top wall 12e. The top wall 12e has apertures therein. The next component of the first assembly is a keypad 13 having an aperture 13a therein. Beneath the keypad 13 is positioned a display 14 and a display printed circuit board 14a. The display 14 is connected to a flying ribbon 14b. An insulating plate 15 is located beneath the board 14a and beneath this is located a metal support plate 16. The parts 12, 13, 14a, 15, 16 have aligned holes 16a therein, so that they can be connected together as a unit by suitable screws or bolts. One such bolt is illustrated in FIG. 1g. It should be recognized that the bolts 17 secures in order the keypad 13, display 14, insulating plate 15 and support plate 16 to the first die casting 12 by threadably engaging the insulating plate 15 and support plate 16.

The second assembly comprises a second die casting 22, a main logic board 24, and a power supply unit 26. These are all seen in FIG. 2. The second die casting is a generally planar die casting of a particular shape designed to co-operate and interfit with the first die casting 10. For this purpose it has an upstanding rim 22a and is provided with appropriately positioned through holes 22b. The main logic board has through holes 24b which are aligned in registry with the holes 22b of the die casting, so as to permit assembly. A so-called "Taptite" screw 24a for effecting this connection is shown at the top of FIG. 2.

The second die casting 22 also has through holes 22c which are arranged in registry with holes 26c in a plate 26a which forms part of the power supply unit 26.

FIG. 3 illustrates the two assemblies so far described, and this figure also shows side plates 30 which are attached to the second die casting 22 by self tapping screws 32. The first die casting 12 and the second die casting 22 are secured together by means such as by threaded engagement of bolts 31. The screws 32 may be "Taptite" screws. The plates 30 are of metal and serve as part of a heat sink which includes the die casting 22 and, to a lesser extent, the die casting 12. The close physical connection between the parts 12, 22 and 30 permits heat generated in the power supply unit 26 to be effectively disipated, thereby avoiding undesirable over-heating.

It will be appreciated that modifications may be made to the disclosed and illustrated arrangement without departing from the invention. For example, fastening clips or other securing means could be employed if desired to connect together the first and second die castings 12 and 22. While components have been illustrated in FIG. 3 on the upper side of the main logic board 24, it would still be within the present invention to locate certain components on its underside. For certain applications, it may be necessary to include additional insulating plates or support plates within the first assembly 10. Different specific shapes could be employed for the insulating and support plates to meet particular requirements.

We claim:

1. A postage meter housing arrangement including a keypad including a plurality of keys mounted on a keypad board, a display mounted on a display board, a main logic circuit board, and a power supply, the postage meter housing arrangement comprising:

(I) a first assembly having (a) a first die casting for providing radio frequency interference shielding and electromagnetic induction shielding, said first die casting having front, rear, and two side walls all integral with a sloping top wall, the top wall having a display aperture and a plurality of key apertures disposed therein (b) the keypad board being sized such that the periphery of said keypad board is received matingly between said front, rear, and side walls of said first die casting locating a respective key of said keypad in a respective key aperture and having a display aperture matingly aligned to said display aperture, (c) the display board being sized such that the periphery of said display board is received matingly between said front, rear and side walls of said first die casting locating said display matingly in said display aperture of said keypad board and the display aperture in said top wall, (d) a metal support plate, said metal support plate disposed on said display board opposite said keypad board, and (e) an insulating plate, said insulating plate disposed on said metal support plate opposite said display board; and (II) a second assembly having a second die casting, the second die casting having a front, rear and two side walls all integral with a top wall having an upper and lower surface, said front, rear and two side walls all vertically aligned in a co-planar manner with the respective front, rear and two side walls of said first die casting, to an upper surface of said top wall is attached the main logic circuit board such that the periphery of said main logic circuit is received matingly between said front, rear and two side walls of said second die casting and to the lower surface is attached the power supply unit, the second die casting being substantially planar and having a rim which interfits with the lower edges of the die casting of the first assembly.

2. A housing arrangement according to claim 1 in which a flying ribbon comprising multiple electrical conductors is connected at one end to the display and at the other end to the main logic board.

3. A housing arrangement according to claim 1 in which metal plates serving as heat sinks are attached to the second die casting.

4. A housing arrangement according to claim 3 in which the metal plates are attached to and one at each side of the second die casting.

5. A housing arrangement according to claim 4 in which a flying ribbon comprising multiple electronic conductors is connected at one end to the display and at the other end to the main logic board.

* * * * *